PROCESS FOR THE FABRICATION OF SEMICONDUCTOR MATERIALS

Filed Aug. 3, 1970

INVENTOR
Don L. Kendall

BY Gary C. Honeycutt
ATTORNEY

United States Patent Office 3,810,791

Patented May 14, 1974

3,810,791

PROCESS FOR THE FABRICATION OF SEMICONDUCTOR MATERIALS

Don Leslie Kendall, Richardson, Tex., assignor to Texas Instruments Incorporated, Dallas, Tex.

Filed Aug. 3, 1970, Ser. No. 60,483
Int. Cl. H01l 7/54
U.S. Cl. 148—1.5 8 Claims

ABSTRACT OF THE DISCLOSURE

A semiconductor wafer having a simulated epitaxial layer is produced by proton-enhanced out-diffusion. For example, a silicon wafer uniformly doped with $10^{16}$ atoms per cm.$^3$ antimony and $10^{18}$ atoms per cm.$^3$ of phosphorus is subjected to proton bombardment whereby a substantial portion of the phosphorous dopant is selectively removed from a surface layer. This produces a simulated epitaxial layer wherein the resistivity is determined by the initial concentration of antimony, while the resistivity of the substrate is determined by the initial concentration of phosphorus.

Figure 1:
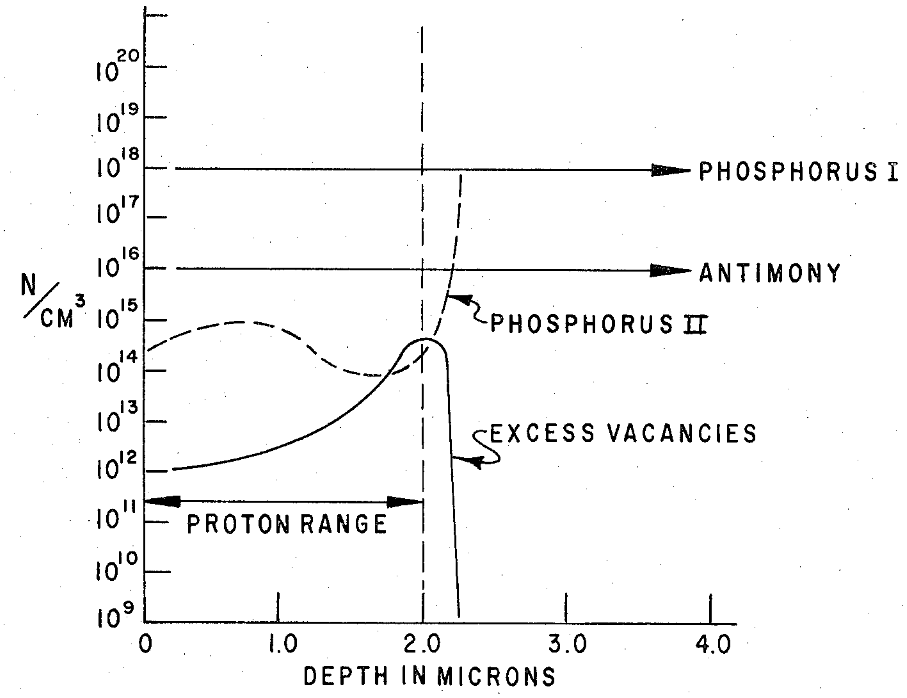

This invention relates to the fabrication of semiconductor materials for use in the manufacture of semiconductor devices and integrated circuits. More particularly, the invention relates to the fabrication of monocrystalline semiconductor materials having simulated epitaxial layers produced by selective out-diffusion enhanced by proton bombardment.

The use of epitaxial layers in the fabrication of semiconductor devices and integrated circuits has been a common practice for many years. A typical method for the growth of epitaxial silicon begins with the careful preparation of a substrate surface, in order to remove contaminants on an atomic scale and to provide a crystallographically oriented surface having an exceptional degree of planarity. Despite the most careful surface preparation, howeve, the initial growth of an epitaxial layer is often characterized by lattice dislocations or other imperfections.

Epitaxial deposition of silicon generally involves the hydrogen reduction of silicon tetrachloride, trichlorosilane, or silane at temperatures around 1000° C. The flow rates and reactant ratios are usually quite critical, in addition to temperature control. An additional parameter is the requirement for separate careful control over the doping levels introduced during epitaxial deposition.

Despite the most careful control of all these parameters, yields obtained in the production of epitaxial wafers have ranged well below 90% due to crystal lattice imperfections and the lack of uniform thickness in the epitaxial layer from wafer to wafer and from place to place on individual wafers.

Also, there has been a trend in the industry toward the use of thinner epitaxial layers. The need has recently arisen for epitaxial thicknesses below five microns, and the need may soon arise for epitaxial layers having a thickness of one micron or less. Uniform layers of three microns or less are difficult to produce by vapor deposition techniques, and the production of one-micron layers by conventional methods may never be realized on a commercial basis.

Accordingly, it is an object of the present invention to produce simulated epitaxial layers without the need for careful surface preparation of a substrate, and without the need for high-temperature operation. It is a further object of the invention to fabricate semiconductor wafers having simulated epitaxial layers of more uniform depth, more uniform doping, and having a greater degree of crystallographic perfection than is normally obtainable by using known prior methods.

The invention is embodied in a method for the fabrication of a semiconductor body having a simulated epitaxial layer, beginning with the step of doping a semiconductor body with at least two conductivity type-determining impurities. The two impurities are seelcted so that one has a substantially greater diffusion coefficient than the other. Both impurities may be p-type; both may be n-type; or one may be n-type and one p-type.

A selected surface of the doped semiconductor body is then bombarded with atomic or subatomic particles, including protons, for example, having an energy just sufficient to penetrate the semiconductor body to a depth which corresponds approximately to the thickness of the simulated epitaxial layer to be formed. The bombardment is continued for a time sufficient to cause selective out-diffusion of the impurity having the greater diffusion coefficient.

The invention is applicable to the fabrication of simulated epitaxial layers in silicon, germanium, gallium arsenide and gallium arsenide phosphide, for example, and all other known semiconductors. Suitable conductivity type-determining impurities for doping each of the various semiconductors are well known in the art and need not be listed for the purposes of the present disclosure. In selecting a suitable pair of known impurities for the purposes of the present invention, it is essential that the diffusion coefficient differ by at least a factor of 2 and preferably by a factor of at least 10.

Published values of diffusion coefficients for the various dopants are readily available. Although the published data are based on thermal diffusion, without proton bombardment or other enhancement, it will be apparent that the ratio of one diffusion coefficient to another remains substantially the same, with or without such enhancement, since in effect, the excess vacancies generated by bombardment at a given crystal temperature are indistinguishable from thermal generated vacancies which would appear at a substantially higher temperature. Accordingly, since the diffusion rate of a given dopant is dependent on the number of vacancies, whether generated thermally or by bombardment, the relative rates at which the respective dopants diffuse under the influence of bombardment can readily be determined from a consideration of published values of thermal diffusion coefficients.

In one embodiment of the invention the two impurities are uniformly distributed throughout the semiconductor body prior to bombardment. With a beam energy selected to provide penetration to the approximate depth of the simulated epitaxial layer, the uniformly doped substrate is then subjected to bombardment whereby the impurity having the greater diffusion coefficient is selectively removed by out-diffusion, thereby forming a simulated epitaxial layer having a thickness determined by the bombardment depth. The resistivity of the epi layer is determined by the doping level of the impurity having the smaller diffusion coefficient, since the concentration profile of the less mobile dopant remains substantially unchanged.

In another embodiment, the two impurities are initially diffused into a selected surface of the semiconductor body, whereby normal diffusion profiles are obtained. Thereafter, by proton-enhanced diffusion, the impurity having the greater diffusion coefficient is selectively out-diffused, to form a simulated epitaxial layer having a uniform depth corresponding approximately to the penetration depth of the proton beam. By selecting a proton penetration depth more shallow than the initial diffusion depth, a substrate layer just below the simulated epi layer is provided having a resistivity substantially less than that of the remaining substrate. In such an embodiment the proper selection of impurities, phosphorus and indium, for example, provides an N N+P structure, readily recognizable as a starting point in the fabrication of integrated circuits wherein the transistor collector regions include a buried low resistivity layer for the purpose of providing a low saturation resistance.

It is preferable to maintain a semiconductor body such as silicon at an elevated temperature of 400°–800° C. during the selective out-diffusion step. That is, by maintaining the semiconductor at a temperature below that where thermal diffusion occurs to a significant degree, it is possible to achieve practical out-diffusion rates with relatively small beam currents and/or shorter exposure times. A suitable rule of thumb for other semiconductors would depend on the rate one could generate excess vacancies with an achievable beam current. The range would generally be between 0.4 and 0.7 of the melting point of the last lattice material (in degrees Kelvin).

As an alternative to proton bombardment the selective out-diffusion step is also enhanced by bombardment with an electron beam or with a beam of ionic deuterium, tritium, helium or lithium, for example. Heavier ion beams are also capable of enhancing out-diffusion in the manner described, although progressively more complex damage is generally introduced which may be difficult to anneal. However, these damage centers may be helpful in some device applications where a high concentration of recombination centers is desirable for minority carrier lifetime reduction. Thus one would not exclude the possibility of bombarding silicon with a conductivity affecting impurity such as phosphorus or boron, an inert element such as argon or even silicon itself; or even an element that results in a change in the energy gap such as germanium or carbon. The unifying concept in all cases would be that enhanced out-diffusion of at least one impurity would occur during the bombardment process.

Suitable equipment is commercially available for generating such high energy ion beams for use in practicing the present invention. For example, the transformer type high voltage accelerators marketed by Accelerators Incorporated of Austin, Tex., are suitable up to an energy range of about 300 kev. Higher beam energies, up to several mev., are produced by the well-known Van de Graaff accelerators. The beams produced are monoenergetic, whereby all the ions penetrate to the same depth (for a given crystal orientation) thereby enabling the method of the invention to produce a simulated epitaxial layer of extremely uniform thickness. Good definition is therefore possible in the fabrication of semiconductor slices having a simulated epitaxial layer of one micron or less in thickness.

THE DRAWINGS

FIG. 1 is a plot of dopant concentration versus depth, illustrating the phosphorous impurity profile near the surface of a silicon wafer before and after proton bombardment in accordance with the invention.

Figure 2:
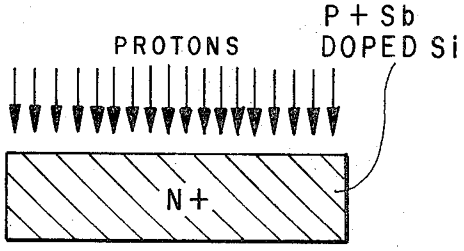
Figure 3:
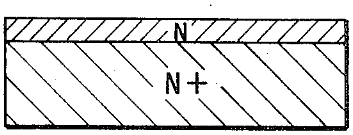
Figure 4:
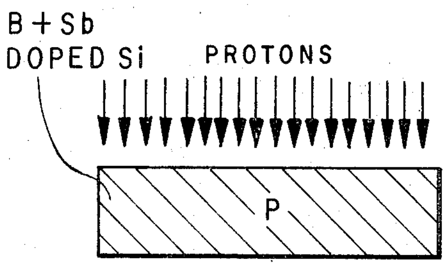
Figure 5:
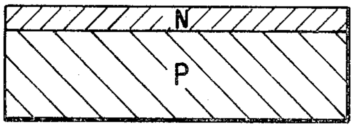

FIGS. 2 and 3 are cross-sectional views of a silicon wafer, illustrating an embodiment of the invention used in the fabrication of a simulated epitaxial layer of n-type conductivity having a high resistivity on a substrate of the same conductivity type having a substantially lower resistivity FIGS. 4 and 5 are cross-sectional views of a silicon wafer illustrating an embodiment of the invention used in the fabrication of a simulated epitaxial layer of n-type conductivity on a substrate of p-type conductivity.

As illustrated in FIG. 1, a silicon wafer is initially doped uniformly with $10^{16}$ atoms per cm.$^3$ of antimony and $10^{18}$ atoms per cm.$^3$ of phosphorus. The wafer is then heated to about 600° C. and subjected to proton bombardment of energy 300 kev. at a current of 1 ma. for 30 minutes. The protons generate an excess vacancy profile which peaks at the 2-micron depth as shown in FIG. 1. These vacancies cause a selective out-diffusion of phosphorus due to its substantially greater diffusion coefficient compared to antimony. The dashed curve labeled "Phosphorus II" shows the phosphorus profile after bombardment, clearly indicating that the simulated epitaxial layer extends to a depth slightly greater than 2 microns and that the doping level therein is determined primarily by the initial concentration of antimony. The resistivity of the substrate is determined primarily by the initial concentration of phosphorus.

FIGS. 2 and 3 are cross-sectional views of a silicon wafer before and after proton bombardment, having the profiles illustrated in FIG. 1.

In FIG. 4 a silicon wafer is uniformly doped with $10^{18}$ atoms per cm.$^3$ of boron and $10^{16}$ atoms per cm.$^3$ of antimony. The wafer is bombarded with protons having a range of about 2 microns which generates an excess vacancy profile substantially the same as shown in FIG. 1. While the substrate retains p-type conductivity due to the excess of boron over antimony, the surface layer is converted to n-type conductivity by selective out-diffusion of boron, thereby generating a pn-junction at a depth slightly greater than 2 microns. The profile of the antimony is the same as illustrated in FIG. 1 whereas the boron profile before and after bombardment corresponds essentially to the phosphorus profiles I and II, respectively, illustrated in FIG. 1.

A substrate of n-type conductivity and an epi layer of p-type conductivity is obtained by doping initially with $10^{18}$ atoms per cm.$^3$ of phosphorus and $10^{16}$ atoms per cm.$^3$ of indium.

The beam energy selected for bombardment determines the depth of penetration, or range, into the semiconductor body. For example, a proton beam energy of 300 kev. penetrates monocrystalline silicon to a depth of about 2 microns. The ratio of the beam current to the target area determines in each instance the required exposure time to achieve the desired amount of out-diffusion. In the embodiment illustrated by FIGS. 1–3 the beam current is 1 ma., the target area is 10 cm.$^2$, and the exposure time required is 30 minutes.

At the conclusion of the out-diffusion step there is frequently a buildup of dopant concentration at the wafer surface which is disproportionately large with respect to the average concentration in the simulated epitaxial layer. This effect can be easily ocrrected by a subsequent step of etching away the anomalous skin region or by an oxidation step to convert the skin region to oxide. In certain situations, it would be advantageous to leave this layer intact, such as in FIG. 5 where the resulting structure would be a p+np structure, which forms the basis of a transistor.

In another variation of the method, the beam energy is reduced sequentially during bombardment in order to make the out-diffusion more efficient. This is due to the fact that the largest out-diffusion effects are produced near the end of the proton range; thus, a hump such as that shown in FIG. 1 for the phosphorus at a depth of 1 micron may develop. Sequential reduction in the proton beam energy will act to "sweep" these impurities toward the surface.

In a further variation of the method, the beam energy is reduced after the initial bombardment such that continued out-diffusion is limited to a depth which is substantially more shallow than the initial bombardment depth. As a result of the continued out-diffusion in the more shallow region, a three-layer structure results consisting of the substrate, having a first resistivity and conductivity type, plus a simulated epitaxial region thereon consisting of two layers, the conductivity type and resistivities of which may be independently selected. Such an approach produces a PIN structure, for example, by bombarding a wafer as illustrated in FIG. 4 to a first depth for a time sufficient to balance the boron and antimony concentrations, followed by continued bombardment to a more shallow depth whereby continued outdiffusion of boron then produces a simulated epitaxial layer having a surface layer of n-type conductivity and a region of compensated intrinsic character located adjacent the substrate region of n-type conductivity.

The bombardment step illustrated by FIG. 2, and by FIG. 4, includes the entire wafer surface as the target area. It is equally feasible to limit the target area to a selected portion of the wafer surface, either by using an apertured mask, for example, or by "writing" on the wafer surface in a predetermined pattern using a beam of very limited area.

A further embodiment of the invention involves the selective out-diffusion of impurities that have a major effect on carrier lifetime rather than conductivity. Thus, gold in silicon could be readily removed from a region of the semiconductor body by this technique, thereby producing a local variation in lifetime.

What is claimed is:

1. A method for the fabrication of a semiconductor body having a simulated epitaxial layer comprising the steps of:

(a) doping a semiconductor body with at least two impurities, one of said impurities having a substantially greater diffusion coefficient than the other; and (b) bombarding a surface of said semiconductor with atomic or sub-atomic particles having an energy just sufficient to penetrate the semiconductor body to the approximate depth of the simulated epitaxial layer to be formed, for a time sufficient to cause selective out-diffussion of the impurity having the greater diffusion coefficient.

2. A method as defined by claim 1 wherein one impurity is a donor, the other is an acceptor, the acceptor impurity is initially present in excess over the donor, and has the greater diffusion coefficient.

3. A method as defined by claim 2 wherein said semiconductor is silicon, said donor is antimony and said acceptor is boron.

4. A method as defined by claim 1 wherein one impurity is a donor, the other is an acceptor, the donor is initially present in excess over the acceptor, and has the greater diffusion coefficient.

5. A method as defined by claim 4 wherein the donor is phosphorus and the acceptor is indium.

6. A method as defined by claim 1 wherein the bombardment is selectively limited to a predetermined area on the semiconductor surface, by masking the semiconductor or by scanning a point-beam across a selected area.

7. A method for the fabrication of a semiconductor body having a simulated epitaxial layer comprising the steps of:

(a) doping a semiconductor body with at least two conductivity type-determining impurities, including a donor and an acceptor having a greater concentration and a greater diffusion coefficient than said donor; and (b) bombarding a surface of said doped semiconductor with atomic or subatomic particles having an energy just sufficient to penetrate to the approximate depth of the simulated epi layer to be formed, for a time sufficient to cause only a partial out-diffusion of the acceptor and thereby generate a pnp device.

8. A method for the fabrication of a semiconductor body having a simulated epitaxial layer comprising the steps of:

(a) doping a semiconductor with a donor and an acceptor impurity, said acceptor having a greater concentration and a greater diffusion coefficient than the donor;

(b) bombarding a surface of the doped semiconductor with atomic or subatomic particles having a first energy for a time just sufficient to balance the impurity concentrations in a selected portion of the body; and (c) bombarding said surface with atomic or subatomic particles having a substantially lower energy than said first energy, whereby a shallow region adjacent said surface is converted to p-type conductivity.

References Cited

UNITED STATES PATENTS

| | | | |
|---|---|---|---|
| 3,298,880 | 1/1967 | Takagi et al. | 148—191 |
| 3,320,103 | 5/1967 | Drake et al. | 148—191 |
| 3,260,624 | 7/1966 | Wiesner | 148—191 X |

OTHER REFERENCES

"Radiation-Enhanced Diffusion of Boron in Silicon," Nelson et al. Applied Physics Letters, vol. 15, No. 8, Oct. 15, 1969, pp. 246–248.

L. DEWAYNE RUTLEDGE, Primary Examiner

J. M. DAVIS, Assistant Examiner

U.S. Cl. X.R.

148—175, 191; 317—235